(12) United States Patent
Su et al.

(10) Patent No.: US 12,382,773 B2
(45) Date of Patent: Aug. 5, 2025

(54) PEROVSKITE SOLAR CELL, PREPARATION METHOD THEREOF, AND ELECTRIC DEVICE

(71) Applicant: CONTEMPORARY AMPEREX TECHNOLOGY (HONG KONG) LIMITED, Hong Kong (CN)

(72) Inventors: Shuojian Su, Ningde (CN); Yongsheng Guo, Ningde (CN); Chuying Ouyang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/330,624

(22) Filed: Jun. 7, 2023

(65) Prior Publication Data

US 2023/0320110 A1 Oct. 5, 2023

Related U.S. Application Data

(63) Continuation of application No. PCT/CN2022/081265, filed on Mar. 16, 2022.

(30) Foreign Application Priority Data

Apr. 13, 2021 (CN) .......................... 202110397769.1

(51) Int. Cl.
*H01L 31/00* (2006.01)
*H01G 9/00* (2006.01)
(Continued)

(52) U.S. Cl.
CPC ............ *H10K 30/40* (2023.02); *H01G 9/0029* (2013.01); *H01G 9/20* (2013.01); *H10K 30/50* (2023.02);
(Continued)

(58) Field of Classification Search
CPC ...... H10K 30/88; H10K 30/50; H10K 71/811; H10K 85/50; H01G 9/0029; H01G 9/20
See application file for complete search history.

(56) References Cited

U.S. PATENT DOCUMENTS 4,555,586 A * 11/1985 Guha ................. H01L 31/03767
136/258
2018/0301288 A1 10/2018 Irwin et al.

FOREIGN PATENT DOCUMENTS

| CN | 106876586 A | 6/2017 |
|---|---|---|
| CN | 109411611 A | 3/2019 |

(Continued)

OTHER PUBLICATIONS

Hong et al., "Improvement and Regeneration of Perovskite Solar Cells via Methylamine Gas Post-Treatment", Adv. Funct. Mater. 2017, 27, 1703060, pp. 1-8 (Year: 2017).*

(Continued)

*Primary Examiner* — Thanh Truc Trinh
(74) *Attorney, Agent, or Firm* — Ladas & Parry LLP

(57) ABSTRACT

Embodiments of this application provide a perovskite solar cell, a preparation method thereof, and an electric device. The perovskite solar cell includes: a back plate; a transparent substrate, where a sealed cavity is formed between the transparent substrate and the back plate; and a perovskite solar cell device, where the perovskite solar cell device is located in the sealed cavity; where the sealed cavity contains ammonia gas having a volume fraction of 10%-100% and residual inert gas. The 10%-100% ammonia gas can improve chemical stability of a perovskite material, thus improving thermal stability of the perovskite solar cell device, and further improving efficiency and service life of the perovskite solar cell.

5 Claims, 2 Drawing Sheets

(51) Int. Cl.
- H01G 9/20 (2006.01)
- H10K 30/40 (2023.01)
- H10K 30/50 (2023.01)
- H10K 30/88 (2023.01)
- H10K 71/00 (2023.01)
- H10K 71/40 (2023.01)
- H10K 85/50 (2023.01)

(52) U.S. Cl.
CPC ............. *H10K 30/88* (2023.02); *H10K 71/40* (2023.02); *H10K 71/811* (2023.02); *H10K 85/50* (2023.02)

(56) References Cited

FOREIGN PATENT DOCUMENTS

| CN | 208923201 U | | 5/2019 |
|---|---|---|---|
| CN | 112242490 A | | 1/2021 |
| JP | 2003-190185 | * | 7/2003 |
| JP | 2014143077 A | | 8/2014 |
| KR | 20210007213 A | | 1/2021 |
| WO | 2019230534 A1 | | 12/2019 |
| WO | 2021205336 A1 | | 10/2021 |

OTHER PUBLICATIONS

Pang et al., "Non-aliphatic Protic Ammonia for Post Healing of Formamidinium-containing Perovskite Films", Research Square, Posted Date: Jan. 13, 2021, pp. 1-18. (Year: 2021).*
Feng et al., "Investigation on the role of amines in the liquefaction and recrystallization process of MAPbI3 perovskite", J. Mater. Chem. A, 2020, 8, 13585-13593. (Year: 2020).*
Translation of JP 2003-190815, pp. 1-11 (Year: 2003).*
Park et al., "Organometal Halide Perovskite Solar Cells with Improved Thermal Stability via Grain Boundary Passivation Using a Molecular Additive", Adv. Funct. Mater. 2017, 27, 1703546, pp. 1-8. (Year: 2017).*
Notice of First Examination Opinion, dated Jun. 9, 2023, corresponding to CN Application No. 202110397769.1.
Notice of Grant of Invention Patent Right, dated Jul. 10, 2023, corresponding to CN Application No. 202110397769.1.
ISR for International Application PCT/CN2022/081265 mailed Apr. 25, 2022.
Written Opinion for International Application PCT/CN2022/081265 mailed Apr. 25, 2022.
Extended European Search Report dated May 14, 2024 for Application No. EP 22787318.9.
Lei Shi et al, "Gas chromatography-mass spectrometry analyses of encapsulated stable perovskite solar cells", Science, vol. 368, No. 6497, May 21, 2020 (May 21, 2020), p. eaba2412.
Lei Zhang et al, "Understanding interactions between halide perovskite surfaces and atmospheric/VOC gas molecules: an investigation", Journal of Physics D: Applied Physics, Institute of Physics Publishing, Bristol, GB, vol. 51, No. 31, Jul. 11, 2018 (Jul. 11, 2018), p. 315302.

* cited by examiner

PEROVSKITE SOLAR CELL, PREPARATION METHOD THEREOF, AND ELECTRIC DEVICE

CROSS-REFERENCE TO RELATED APPLICATIONS

This application is a continuation of International application PCT/CN2022/081265 filed on Mar. 16, 2022 that claims priority to Chinese patent application No. 202110397769.1 filed on Apr. 13, 2021 and entitled "PEROVSKITE SOLAR CELL, PREPARATION METHOD THEREOF, AND ELECTRIC DEVICE". The content of these applications are incorporated herein by reference in its entirety.

TECHNICAL FIELD

This application relates to the field of battery technologies, and in particular, to a perovskite solar cell, a preparation method thereof, and an electric device.

BACKGROUND

With poor stability, perovskite materials are easy to decompose under actions of light, heat, water, and oxygen, reducing photoelectric conversion efficiency of perovskite solar cells. Therefore, it is necessary to ensure that a perovskite solar cell device is prepared with good sealing performance.

However, the perovskite battery device with only good sealing performance ensured during packaging has a limited effect on prolonging service life of a perovskite solar cell.

SUMMARY

Embodiments of this application are intended to provide a perovskite solar cell, a preparation method thereof, and an electric device, so as to prolong service life of the perovskite solar cell.

A first aspect of this application provides a perovskite solar cell, including:
a back plate;
a transparent substrate, where a sealed cavity is formed between the transparent substrate and the back plate; and
a perovskite solar cell device, where the perovskite solar cell device is located in the sealed cavity; where
the sealed cavity contains ammonia gas having a volume fraction of 10%-100% and residual inert gas, and a chemical formula of a perovskite material of the perovskite solar cell device is $ABX_3$, where A includes an organic amine cation, B is a metal cation, and X is a halogen anion or $SCN^-$.

In this application, the 10%-100% ammonia gas and the residual inert gas are contained in a structure of the perovskite solar cell containing the organic amine cation, which can effectively inhibit migration and decomposition of organic amine cations in the perovskite material and improves thermal stability of the perovskite solar cell device, thereby improving light conversion efficiency and service life of the perovskite solar cell.

In some embodiments of the first aspect of this application, A includes at least one of $CH_3NH_3^+$ and $HC(NH_2)_2^+$.

Optionally, in $ABX_3$, B is at least one of $Pb^{2+}$, $Sn^{2+}$, and $Ge^{2+}$.

In some embodiments of the first aspect of this application, in $ABX_3$, A further includes at least one of $Cs^+$, $Rb^+$, and $K^+$.

In some embodiments of the first aspect of this application, the inert gas includes at least one of nitrogen, argon, helium, and neon.

Optionally, the volume fraction of the ammonia gas in the sealed cavity is 30%-90%.

Optionally, the volume fraction of the ammonia gas in the sealed cavity is 50%-70%.

In this application, the volume fraction of the ammonia gas being controlled within the above ranges in the sealed cavity can ensure various advantages such as low production costs, high light conversion efficiency of the solar cell, and operation safety.

In some embodiments of the first aspect of this application, the perovskite solar cell further includes a sealing element, where the sealing element connects the transparent substrate and the back plate to form the sealed cavity.

Optionally, the sealing element is a sealant.

Optionally, the sealant is around a periphery of the perovskite solar cell device, and the back plate is fastened to the perovskite solar cell device using the sealant.

Optionally, the sealant is further located on at least part of a surface or the entire surface on a side of the back plate facing toward the perovskite solar cell device.

In some embodiments of the first aspect of this application, a material of the transparent substrate is glass or polyethylene terephthalate.

Optionally, a material of the back plate is glass or polyethylene terephthalate.

A second aspect of this application provides a preparation method of perovskite solar cell, including:
providing a transparent substrate and a back plate; and
in a preset atmosphere, packaging a perovskite solar cell device between the transparent substrate and the back plate; where
the preset atmosphere contains ammonia gas having a volume fraction of 10%-100% and residual inert gas, and a chemical formula of a perovskite material of the perovskite solar cell device is $ABX_3$, where A includes an organic amine cation, B is a metal cation, and X is a halogen anion or $SCN^-$.

The perovskite solar cell device is packaged in the preset atmosphere containing the ammonia gas having the volume fraction of 10%-100% and the residual inert gas, so that the perovskite solar cell device is located in the above preset atmosphere; and the present atmosphere can inhibit migration and decomposition of organic amine cations in the perovskite material containing the organic amine cation.

In some embodiments of the second aspect of this application, in $ABX_3$, A includes at least one of $CH_3NH_3^+$ and $HC(NH_2)_2^+$.

Optionally, in $ABX_3$, B is at least one of $Pb^{2+}$, $Sn^{2+}$, and $Ge^{2+}$.

Optionally, in $ABX_3$, A further includes at least one of $Cs^+$, $Rb^+$, and $K^+$.

In some embodiments of the second aspect of this application, the inert gas includes at least one of nitrogen, argon, helium, and neon.

Optionally, the volume fraction of the ammonia gas in the preset atmosphere is 30%-90%.

Optionally, the volume fraction of the ammonia gas in the preset atmosphere is 50%-70%.

Packaging in the above preset atmosphere can allow the preset atmosphere to be packaged inside the perovskite solar cell device, which reduces costs in a manufacturing process when the efficiency and service life of the battery are increased.

In some embodiments of the second aspect of this application, in the process of packaging a perovskite solar cell device between the transparent substrate and the back plate, a sealing element is used for packaging.

Optionally, the sealing element is a sealant.

Optionally, the sealant is applied at a periphery of the perovskite solar cell device, and the back plate is fastened to the perovskite solar cell device using the sealant.

Optionally, the sealant is further applied on at least part of a surface or the entire surface on a side of the back plate facing toward the perovskite solar cell device.

A third aspect of this application provides an electric device, where the electric device includes the perovskite solar cell according to the first aspect, and the perovskite solar cell serves as a power source or an energy storage unit of the electric device.

BRIEF DESCRIPTION OF DRAWINGS

To describe the technical solutions in the embodiments of this application more clearly, the following briefly describes the accompanying drawings required for describing the embodiments of this application. Apparently, the accompanying drawings in the following description show merely some embodiments of this application, and persons of ordinary skill in the art may still derive other drawings from the accompanying drawings without creative efforts.

Reference signs: 100. perovskite solar cell; 101. sealed cavity; 110. back plate; 120. transparent substrate; 121. positive electrode leading-out terminal; 122. negative electrode leading-out terminal; 130. perovskite solar cell device; 131. transparent conductive electrode; 132. hole transport layer; 133. perovskite layer; 134. electron transmission layer; 135. metal conductive layer; and 140. sealing element.

DESCRIPTION OF EMBODIMENTS

To make the objectives, technical solutions, and advantages of this application clearer, the following clearly and completely describes the technical solutions of the embodiments of this application. Embodiments, where specific conditions are not specified, are implemented in accordance with general conditions or those recommended by a manufacturer. The reagents or instruments used are all conventional products that can be purchased on the market if no manufacturer is indicated.

Figure 1:
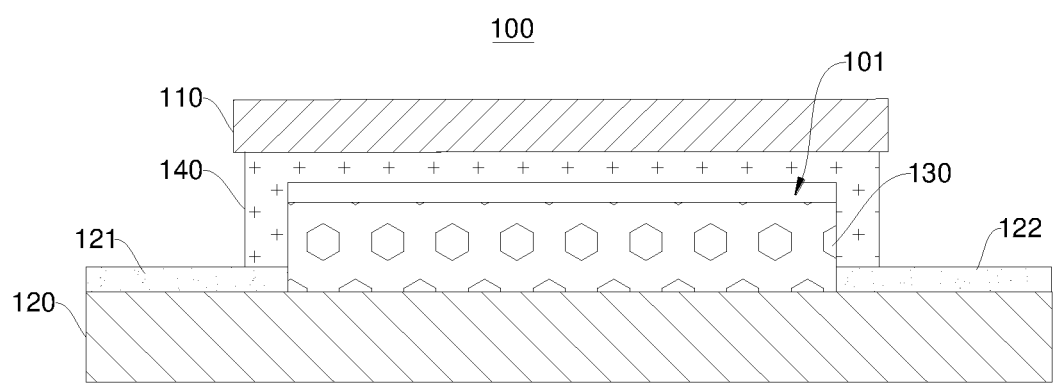
FIG. 1 is a schematic cross-sectional diagram of a perovskite solar cell according to an embodiment of this application.

FIG. 1 is a schematic cross-sectional diagram of a perovskite solar cell 100 according to an embodiment of this application. Referring to FIG. 1, this embodiment provides a perovskite solar cell 100, where the perovskite solar cell 100 mainly includes a back plate 110, a transparent substrate 120, and a perovskite solar cell device 130.

A sealed cavity 101 is formed between the back plate 110 and the transparent substrate 120, and the perovskite solar cell device 130 is located in the sealed cavity 101.

In some embodiments of this application, the perovskite solar cell 100 further includes a sealing element 140, where the sealing element 140 is located between the back plate 110 and the transparent substrate 120, and the back plate 110, the transparent substrate 120, and the sealing element jointly enclose the sealed cavity 101.

For example, a side of the transparent substrate 120 is provided with a positive electrode leading-out terminal 121 and a negative electrode leading-out terminal 122; a front face of the perovskite solar cell device 130 is connected to the transparent substrate 120; a positive electrode of the perovskite solar cell device 130 is electrically connected to the positive electrode leading-out terminal 121 and a negative electrode of the perovskite solar cell device 130 is connected to the negative electrode leading-out terminal 122; and a back face of the perovskite solar cell device 130 is connected to the back plate 110, the sealing element 140 is located between the back face of the perovskite solar cell device 130 and the back plate 110, and the sealing element 140 seals the perovskite solar cell device 130.

For example, in this embodiment, a material of the transparent substrate 120 is glass. In another embodiment, a material of the transparent substrate 120 may be another transparent material such as polyethylene terephthalate.

For example, in this embodiment, a material of the back plate 110 is polyethylene terephthalate. In another embodiment, a material of the back plate 110 may alternatively be glass or another material.

In this embodiment, the sealing element 140 is a sealant; and for example, the sealant may seal the perovskite solar cell device 130 through the following implementations.

Referring to FIG. 1, the sealant is applied on an entire surface of the perovskite solar cell device 130 facing away from the transparent substrate 120 and at a periphery of the perovskite solar cell device 130, and the back plate 110 is attached to the sealant to seal the perovskite solar cell device 130; or alternatively, the sealant is applied on a surface of the back plate 110 facing toward the perovskite solar cell device 130, and the back plate 110 is attached to the sealant to seal the perovskite solar cell device 130; and the sealed cavity 101 is present between the sealant and the perovskite solar cell device 130.

It should be noted that the sealed cavity 101 may be provided in a quantity of one or more, and a plurality of sealed cavities 101 may communicate with each other or not.

The sealant being applied on the entire surface of the perovskite solar cell device 130 facing away from the transparent substrate 120 helps improve mechanical property of the perovskite solar cell 100, increasing firmness and stability of a packaging structure of the perovskite solar cell 100.

Figure 2:
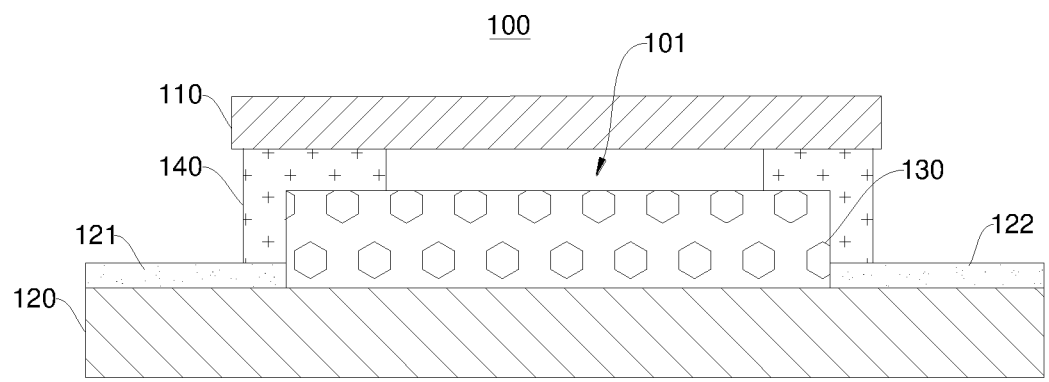
FIG. 2 is a schematic cross-sectional diagram of another perovskite solar cell according to an embodiment of this application.

FIG. 2 is a schematic cross-sectional diagram of a perovskite solar cell 100 according to an embodiment of this application. Referring to FIG. 2, in FIG. 2, the sealant is around a periphery of the perovskite solar cell device 130 and on a partial surface of the perovskite solar cell device 130 facing away from the transparent substrate 120. The sealant may seal the perovskite solar cell device 130 in the following manners.

The sealant is applied at the periphery of the perovskite solar cell device 130, and the back plate 110 is attached to the sealant to seal the perovskite solar cell device 130. Alternatively, the sealant is applied at a periphery of the back plate 110 facing toward the perovskite solar cell device 130, and the back plate 110 is attached to the sealant to seal the perovskite solar cell device 130.

The sealed cavity 101 is present between the perovskite solar cell device 130 and the back plate 110; or in some embodiments, due to an uneven surface of the perovskite solar cell device 130 or other reasons, there may alternatively be at least one sealed cavity 101 between the perovskite solar cell device 130 and the sealant.

In this embodiment of this application, the above two examples are made with respect to sealing of the perovskite solar cell device 130 using the sealant. It should be noted that, in another embodiment of this application, the sealant may seal the perovskite solar cell device 130 in another manner. For example, the sealant is applied at the periphery of the back plate 110 facing toward the perovskite solar cell device 130 and on an entire surface of the back plate 110, and the back plate 110 is attached to the sealant to seal the perovskite solar cell device 130.

Correspondingly, the sealed cavity 101 formed may be located between the sealant and the perovskite solar cell device 130, or may alternatively be located between the perovskite solar cell device 130 and the back plate 110; or the sealed cavity 101 is provided at both the above positions. A shape and a quantity of the sealed cavity 101 and whether a plurality of sealed cavities 101 communicate with each other are not limited in this application.

In addition, in FIG. 1 and FIG. 2, the sealed cavity 101 accounting for a large volume of the entire perovskite solar cell 100 is merely intended for better identifying the sealed cavity 101 in the figure. This does not mean that the volume accounted by the sealed cavity 101 of the entire perovskite solar cell 100 is as shown in FIG. 1 or FIG. 2. It should be noted that the volume occupied by the sealed cavity 101 of the entire perovskite solar cell 100 is not limited in the embodiments of this application. During actual production, the sealed cavity 101 may be a cavity deliberately formed during packaging, or may alternatively be a cavity inevitably formed during packaging; or may include both the above cases.

For example, the sealant is selected from at least one of an epoxy packaging sealant, an organic silicon packaging sealant, a polyurethane packaging sealant, a UV-light curing packaging sealant, ethylene-vinyl acetate copolymer, polyvinyl butyral, ethylene-octene copolymer, polyisobutylene, and a polyolefin packaging sealant.

For example, the sealant is an epoxy packaging sealant, for example, an epoxy AB sealant including sealant A and sealant B of which a mass ratio is 2:(0.5-1.5), and the mass ratio of sealant A to sealant B may be, for example, 2:0.5, 2:0.8, 2:1, 2:1.2 or 2:1.5.

In another embodiment of this application, the sealing element 140 may not be limited to the sealant. For example, another sealing part is used to seal the perovskite solar cell device 130; or no sealing element 140 is used to seal the perovskite solar cell device 130, and the perovskite solar cell device 130 is directly sealed by the transparent substrate 120 and the back plate 110.

In this application, the sealed cavity 101 contains ammonia gas having a volume fraction of 10%-100% and residual inert gas. In other words, gases in the sealed cavity 101 include the ammonia gas having the volume fraction of 10%-100% and the residual inert gas.

For example, the volume fraction of the ammonia gas in the sealed cavity 101 may be 50%-90%, 30%-70%, 60%-80%, or the like.

For example, the volume fraction of the ammonia gas in the sealed cavity 101 may be 10%, 16%, 21%, 30%, 34%, 50%, 60%, 67%, 75%, 80%, 98%, 100%, or the like.

For example, the inert gas may be at least one of nitrogen, argon, helium, and neon. For example, in this embodiment, the inert gas is nitrogen.

It should be noted that the 10%-100% ammonia gas and the residual inert gas do not mean only the above two types of components in an absolute sense. The sealed cavity 101 may further include inevitable trace impurity gas during actual production (generally, a volume fraction of the trace impurity gas is less than 1%).

Figure 3:
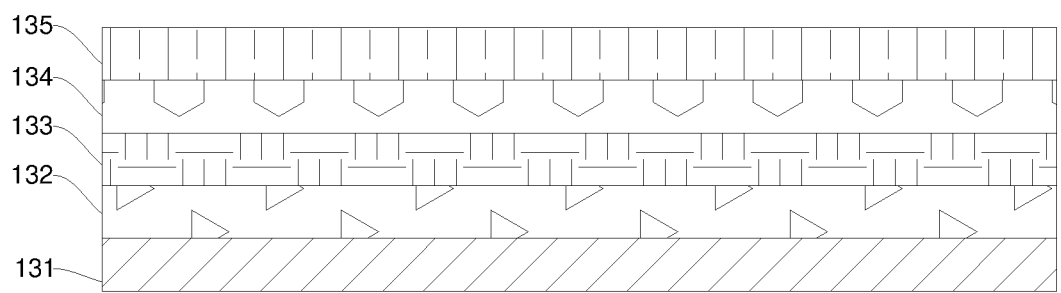
FIG. 3 is a schematic diagram of an internal structure of a perovskite solar cell device according to an embodiment of this application.

FIG. 3 is a schematic diagram of an internal structure of a perovskite solar cell device 130 according to an embodiment of this application. Referring to FIG. 3, the perovskite solar cell device 130 includes a transparent conductive electrode 131, a hole transport layer 132, a perovskite layer 133, an electron transmission layer 134, and a metal conductive layer 135 that are stacked in sequence.

It should be understood that, in another embodiment of this application, the hole transport layer 132 shown in FIG. 3 may be located at the electron transmission layer 134, and the electron transmission layer 134 is located at the hole transport layer 132.

For example, a material of the transparent conductive electrode 131 is selected from at least one of indium tin oxide and fluorine doped with tin dioxide.

A material of the hole transport layer 132 is selected from at least one of poly(3,4-ethylenedioxythiophene), polystyrene sulfonate, poly[bis(4-phenyl)(2,4,6-trimethylphenyl)amine], CuSCN, $NiO_x$, CuI, $MoO_x$, 2,2',7,7'-tetrakis[N,N-bis(4-methoxyphenyl)amino]-9,9'-spirobifluorene, $WO_3$, polyethoxyethyleneimine, polyethyleneimine, ZnO, $TiO_2$, [6,6]-phenyl-C61-isobutyl butyrate, and $SnO_2$.

A material of the electron transmission layer 134 is selected from at least one of poly(3,4-ethylenedioxythiophene), polystyrene sulfonate, polytriarylamine, CuSCN, $NiO_x$, CuI, $MoO_x$, 2,2',7,7'-tetrakis[N,N-bis(4-methoxyphenyl)amino]-9,9'-spirobifluorene, $WO_3$, polyethoxyethyleneimine, polyethyleneimine, ZnO, $TiO_2$, [6,6]-phenyl-C61-isobutylbutyrate, and $SnO_2$.

A material of the metal conductive layer 135 is selected from at least one of Au, Ag, Cu, Al, Ni, Cr, Bi, Pt, Mg, and alloys thereof.

A chemical formula of a perovskite material in the perovskite layer 133 is $ABX_3$, where A includes an organic amine cation, B is a metal cation, and X is a halogen anion or $SCN^-$.

For example, in $ABX_3$, A may include at least one of $CH_3NH_3^+$ and $HC(NH_2)_2^+$. In other words, A may be $CH_3NH_3^+$, $HC(NH_2)_2^+$ or a mixture of the two in any ratio. It should be understood that A may further include a metal ion, for example, at least one of $Cs^+$, $Rb^+$, and $K^+$.

For example, in $ABX_3$, B may be at least one of $Pb^{2+}$, $Sn^{2+}$, and $Ge^{2+}$.

For example, $ABX_3$ may be $CH_3NH_3PbI_3$, $CH_3NH_3SnI_3$, $CH_3NH_3PbI_2Cl$, $CH_3NH_3PbI_2Br$, or $CH_3NH_3Pb(I_{1-x}Br_x)_3$ (where $0<x<1$), where $CH_3NH_3^+$ is abbreviated as $MA^+$, and $HC(NH_2)_2^+$ is abbreviated as $FA^+$; and $ABX_3$ may further be:
$MA_xFA_{1-x}PbI_3$ (where $0<x<1$);
$(MAPbBr_3)_x(FAPbI_3)_{1-x}$ (where $0<x<1$);
$Cs_{0.05}(FA_{0.15}MA_{0.85})_{0.95}Pb(I_{1-x}Br_x)_3$ (where $0<x<1$);
$Rb_{0.02}FA_{0.8}MA_{0.18}Pb(I_{1-x}Br_x)_3$ (where $0<x<1$);
$K_{0.03}FA_{0.8}MA_{0.17}Pb(I_{1-x}Br_x)_3$ (where $0<x<1$); and the like.

In this application, the inventors have found through research that the ammonia gas having the volume fraction of 10%-100% and the residual inert gas being contained in the sealed cavity 101 can effectively inhibit migration and decomposition of organic amine cations in the perovskite material, improve structural stability of the perovskite material, and improve thermal stability of the perovskite solar cell 100, thereby improving light conversion efficiency and service life of the perovskite solar cell.

The volume fraction of the ammonia gas in the sealed cavity 101 is closely related to an effect of improving the structural stability of the perovskite material. On a condition that decomposition is inhibited to some extent, considering cost and safety, the volume fraction of the ammonia gas in the sealed cavity 101 may be within an appropriate range, such as 50%-70%.

For example, this application further shows a preparation method of the perovskite solar cell.

The preparation method mainly includes the following steps.

S1: Prepare a perovskite solar cell device on a transparent substrate. For example, the preparation method mainly includes:

preparing in sequence a transparent conductive electrode, one of a hole transport layer and an electron transmission layer, a perovskite layer, the other of the hole transport layer and the electron transmission layer, and a metal conductive layer on the transparent substrate.

As mentioned above, in a process of preparing the transparent conductive electrode, a material of the transparent conductive electrode is selected from at least one of indium tin oxide and fluorine doped with tin dioxide.

In a process of preparing the hole transport layer or the electron transmission layer, a material of the hole transport layer and a material of the electron transmission layer are each independently selected from at least one of poly(3,4-ethylenedioxythiophene), polystyrene sulfonate, poly[bis(4-phenyl)(2,4,6-trimethylphenyl)amine], CuSCN, $NiO_x$, CuI, $MoO_x$, 2,2',7,7'-tetrakis[N,N-bis(4-methoxyphenyl)amino]-9,9'-spirobifluorene, $WO_3$, polyethoxyethylene imine, polyethyleneimine, ZnO, $TiO_2$, [6,6]-phenyl-C61-isobutyl butyrate, and $SnO_2$.

In a process of preparing the perovskite layer, an optional formula of a material in the perovskite layer is $ABX_3$, where A includes an organic amine cation, B is a metal cation, and X is a halogen anion or $SCN^-$. For example, $ABX_3$ may be $CH_3NH_3PbI_3$, $CH_3NH_3SnI_3$, $CH_3NH_3PbI_2Cl$, or $CH_3NH_3PbI_2Br$, where $CH_3NH_3^+$ is abbreviated as $MA^+$, and $HC(NH_2)_2^+$ is abbreviated as $FA^+$; and $ABX_3$ may further be:

$MA_xFA_{1-x}PbI_3$ (where $0<x<1$);
$(MAPbBr_3)_x(FAPbI_3)_{1-x}$ (where $0<x<1$);
$Cs_{0.05}(FA_{0.15}MA_{0.85})_{0.95}Pb(I_{1-x}Br_x)_3$ (where $0<x<1$);
$Rb_{0.02}FA_{0.8}MA_{0.18}Pb(I_{1-x}Br_x)_3$ (where $0<x<1$);
$K_{0.03}FA_{0.8}MA_{0.17}Pb(I_{1-x}Br_x)_3$ (where $0<x<1$); and the like.

In a process of preparing the metal conductive layer, a material of the metal conductive layer is selected from at least one of Au, Ag, Cu, Al, Ni, Cr, Bi, Pt, Mg, and alloys thereof.

For example, process parameters of step S1 may be as follows.

Part of the transparent substrate is etched with Zn powder and 1 mol/L-2 mol/L hydrochloric acid, and then dried after washing. In a $N_2$ atmosphere, the transparent substrate is spin-coated with a $TiO_2$ precursor solution at a rate of 4000 rpm-6500 rpm, and kept at 120° C.-150° C. for 20 min-25 min; then the temperature is increased to 400° C.-450° C. and maintained at the temperature for 40 min-45 min; and then the transparent substrate is annealed at 120° C.-150° C.

In a $N_2$ atmosphere, the transparent substrate is spin-coated with a perovskite layer (which, for example, may be $CH_3NH_3PnI_3$) at a rate of 3000 rpm-4500 rpm, cured for 8 h-10 h, and then oxidized for 12 h-13 h in a low humidity drying tower.

Then the transparent substrate is vapor-deposited with a layer of electrode, such that a perovskite solar cell device is prepared.

S2: In a preset atmosphere, package the perovskite solar cell device using a back plate, where the preset atmosphere contains ammonia gas having a volume fraction of 10%-100% and residual inert gas.

For example, the packaging includes that the perovskite solar cell device is packaged using a sealing material and the back plate.

Still referring to FIG. 1, a method for packaging the perovskite solar cell device may be: The sealing material is applied at a periphery of the perovskite solar cell device and an entire back face of the perovskite solar cell device, and the back plate is attached to the back face of the perovskite solar cell device to implement sealing. Correspondingly, the sealing material may alternatively be applied on the back plate before the back plate is attached to the back face of the perovskite solar cell device so that the sealing material is applied on the entire back face of the perovskite solar cell device.

Alternatively, still referring to FIG. 2, a method for packaging the perovskite solar cell device may be: The sealing material is applied at a periphery of the perovskite solar cell device, and the back plate is attached to the back face of the perovskite solar cell device to implement sealing. Alternatively, the sealing material may be applied on the back plate before the back plate is attached to the back face of the perovskite solar cell device.

For example, the sealing material may be a sealant, and the sealant may be an epoxy packaging sealant, for example, an epoxy AB sealant. It should be understood that the sealant may also be selected from at least one of an organic silicon packaging sealant, a polyurethane packaging sealant, a UV-light curing packaging sealant, ethylene-vinyl acetate copolymer, polyvinyl butyral, ethylene-octene copolymer, polyisobutylene, and a polyolefin packaging sealant.

It should be noted that, in another embodiment of this application, the sealing material may alternatively be another material that can seal the perovskite solar cell device. Alternatively, in some embodiments, on the premise that the back plate can seal the perovskite solar cell device, the sealing material may not be used to seal the perovskite solar cell device.

For example, the preset atmosphere includes the ammonia gas having the volume fraction of 10%-100%, the residual inert gas, and inevitable trace impurity gas.

For example, the volume fraction of the ammonia gas in the preset atmosphere may be 10%, 16%, 21%, 30%, 34%, 50%, 60%, 67%, 75%, 80%, 98%, 100%, or the like. The inert gas may be at least one of nitrogen, argon, helium, and neon. For example, in this embodiment, the inert gas is nitrogen.

For example, a process of step S2 may be as follows.

In the preset atmosphere, a layer of a packaging sealant is applied at a periphery of the perovskite solar cell device and on a surface of the perovskite solar cell device, and the back plate is pressed onto the packaging sealant before the packaging sealant is cured.

The preparation method of perovskite solar cell provided in this embodiment of this application has at least the following advantages.

Packaging is performed in the preset atmosphere composed of the ammonia gas having the volume fraction of 10%-100% and the residual inert gas, so that the sealed cavity after packaging contains the ammonia gas having the volume fraction of 10%-100%. The foregoing configuration can effectively inhibit migration and decomposition of organic amine cations in the perovskite material and improve thermal stability of the perovskite solar cell device, thereby improving light conversion efficiency and service life of the perovskite solar cell.

An embodiment of this application further provides an electric device, where the electric device includes the foregoing perovskite solar cell 100, and the perovskite solar cell 100 serves as a power source of the foregoing electric device for supplying power, or the perovskite solar cell 100 can be used as an energy storage unit of the foregoing electric device. For example, the electric device may be a lighting element, a display element, an automobile, or the like.

The following further describes features and performance of this application in detail with reference to examples.

Example 1

In this example, a perovskite solar cell was provided and mainly prepared through the following steps.

(1) A piece of FTO conductive glass with a size of 1.5 cm×1.5 cm was selected, ⅔ of an area of a conductive layer of the conductive glass was protected with an M3 waterproof adhesive tape, and ⅓ of the FTO was etched with Zn powder and 1 mol/L hydrochloric acid; and the corroded FTO conductive glass sheet was washed with acetone and isopropyl alcohol for several times in turn, and then finally immersed in deionized water to be subjected to ultrasound test for 10 minutes.

(2) The FTO conductive glass sheet obtained after the treatment in step (1) was dried in a drying oven, spin-coated with a $TiO_2$ precursor solution at a rate of 4000 rpm in a glove box, and then immediately taken out from the glove box and kept at 120° C. for 20 min. The temperature was then increased to 450° C. and maintained at the temperature for 40 min. The FTO conductive glass was annealed at 120° C. and put back to a culture dish and then back to the glove box, where the glove box contained 100% $N_2$.

(3) The conductive glass sheet spin-coated with $TiO_2$ and obtained in step (2) was spin-coated with a $CH_3NH_3PbI_3$ precursor solution at a rate of 4000 rpm, heated on a glove box hot table at 110° C. for 30 min, then the resulting conductive glass was annealed to a room temperature, and a perovskite layer containing a component of $CH_3NH_3PbI_3$ was obtained.

(4) The conductive glass sheet applied with the perovskite layer and obtained in step (3) was spin-coated with a 2,2′,7,7′-tetrakis[N,N-bis(4-methoxyphenyl)amino]-9,9′-spirobifluorene layer at a rate of 4000 rpm in a glove box, then cured in the glove box for about 8 h, and then taken out from the glove box and oxidized for 12 h in a drying tower with a humidity of 10%.

(5) The conductive glass sheet obtained in step (4) and subjected to oxidation treatment was placed into a thermal evaporator and evaporated with an Ag electrode of 100 nm in thickness, and a perovskite solar cell device was obtained.

(6) In a glove box atmosphere containing 10 vol % ammonia gas and 90 vol % nitrogen, a layer of a packaging sealant was applied at a periphery of the perovskite solar cell device and on a back face of the perovskite solar cell device. A glass back plate layer was pressed onto the packaging sealant and left standing for 2 h for curing of the packaging sealant.

The packaging sealant was a colorless transparent epoxy resin AB sealant that was prepared at a mass ratio of A:B=2:1, where A was an epoxy resin main agent, and B was a curing agent.

In this way, a perovskite solar cell was obtained.

Examples 2-28 and Comparative Examples 1-6

Examples 2-28 and Comparative Examples 1-6 each provide a perovskite solar cell. For a preparation method thereof, refer to Example 1. These examples differ from Example 1 in an active substance at the perovskite layer in step (3) or the atmosphere in the glove box in step (6). Details are given in Table 1.

Light conversion efficiency of the perovskite solar cell provided in the examples and comparative examples after storage in a high-temperature and high-humidity environment was tested using a specific test method as follows.

After the perovskite solar cells were stored at 85° C. and 85% relative humidity for different days, light conversion efficiency of the cell was tested using an I-V test system under standard simulated sunlight (AM 1.5G, 100 mW/cm$^2$). A test voltage range was −0.2V-1.2V and a scanning rate was 50 mV/s. Normalized efficiency of the cell on day n=efficiency tested after n days/efficiency tested after 0 days×100%. Test results are shown in Table 1.

TABLE 1

| | Atmosphere in glove box | | | | Normalized efficiency of solar cell | | | | |
|---|---|---|---|---|---|---|---|---|---|
| | Ammonia gas | Inert gas | Type of inert gas | Perovskite active substance | 0 days | 10 days | 20 days | 30 days | 40 days |
| Example 1 | 10% | 90% | Nitrogen | $CH_3NH_3PbI_3$ | 100 | 79 | 73 | 67 | 61 |
| Example 2 | 20% | 80% | Nitrogen | $CH_3NH_3PbI_3$ | 100 | 82 | 78 | 72 | 68 |
| Example 3 | 30% | 70% | Nitrogen | $CH_3NH_3PbI_3$ | 100 | 85 | 82 | 80 | 79 |
| Example 4 | 45% | 55% | Nitrogen | $CH_3NH_3PbI_3$ | 100 | 88 | 85 | 83 | 80 |
| Example 5 | 50% | 50% | Nitrogen | $CH_3NH_3PbI_3$ | 100 | 90 | 88 | 84 | 82 |
| Example 6 | 70% | 30% | Nitrogen | $CH_3NH_3PbI_3$ | 100 | 91 | 889 | 85 | 83 |
| Example 7 | 80% | 20% | Nitrogen | $CH_3NH_3PbI_3$ | 100 | 89 | 87 | 83 | 81 |
| Example 8 | 98% | 2% | Nitrogen | $CH_3NH_3PbI_3$ | 100 | 89 | 87 | 84 | 80 |
| Example 9 | 100% | — | — | $CH_3NH_3PbI_3$ | 100 | 89 | 88 | 83 | 82 |
| Example 10 | 10% | 90% | Argon | $CH_3NH_3PbI_3$ | 100 | 79 | 72 | 66 | 62 |
| Example 11 | 10% | 90% | Nitrogen | $HC(NH_2)_2PbI_3$ | 100 | 85 | 80 | 75 | 70 |
| Example 12 | 30% | 70% | Nitrogen | $HC(NH_2)_2PbI_3$ | 100 | 88 | 85 | 82 | 80 |
| Example 13 | 45% | 55% | Nitrogen | $HC(NH_2)_2PbI_3$ | 100 | 90 | 87 | 84 | 82 |
| Example 14 | 50% | 50% | Nitrogen | $HC(NH_2)_2PbI_3$ | 100 | 92 | 90 | 89 | 87 |
| Example 15 | 70% | 30% | Nitrogen | $HC(NH_2)_2PbI_3$ | 100 | 93 | 91 | 89 | 88 |

TABLE 1-continued

| | Atmosphere in glove box | | | | Normalized efficiency of solar cell | | | | |
|---|---|---|---|---|---|---|---|---|---|
| | Ammonia gas | Inert gas | Type of inert gas | Perovskite active substance | 0 days | 10 days | 20 days | 30 days | 40 days |
| Example 16 | 80% | 20% | Nitrogen | $HC(NH_2)_2PbI_3$ | 100 | 91 | 89 | 87 | 86 |
| Example 17 | 98% | 2% | Nitrogen | $HC(NH_2)_2PbI_3$ | 100 | 91 | 89 | 88 | 87 |
| Example 18 | 100% | — | — | $HC(NH_2)_2PbI_3$ | 100 | 91 | 89 | 87 | 85 |
| Example 19 | 10% | 90% | Argon | $HC(NH_2)_2PbI_3$ | 100 | 85 | 80 | 74 | 70 |
| Example 20 | 10% | 90% | Nitrogen | $Cs_{0.05}FA_{0.8}MA_{0.15}PbI_3$ | 100 | 88 | 85 | 82 | 78 |
| Example 21 | 30% | 70% | Nitrogen | $Cs_{0.05}FA_{0.8}MA_{0.15}PbI_3$ | 100 | 90 | 88 | 85 | 83 |
| Example 22 | 45% | 55% | Nitrogen | $Cs_{0.05}FA_{0.8}MA_{0.15}PbI_3$ | 100 | 92 | 89 | 88 | 87 |
| Example 23 | 50% | 50% | Nitrogen | $Cs_{0.05}FA_{0.8}MA_{0.15}PbI_3$ | 100 | 94 | 92 | 91 | 90 |
| Example 24 | 70% | 30% | Nitrogen | $Cs_{0.05}FA_{0.8}MA_{0.15}PbI_3$ | 100 | 95 | 93 | 92 | 91 |
| Example 25 | 80% | 20% | Nitrogen | $Cs_{0.05}FA_{0.8}MA_{0.15}PbI_3$ | 100 | 94 | 92 | 89 | 88 |
| Example 26 | 98% | 2% | Nitrogen | $Cs_{0.05}FA_{0.8}MA_{0.15}PbI_3$ | 100 | 93 | 91 | 89 | 88 |
| Example 27 | 100% | — | — | $Cs_{0.05}FA_{0.8}MA_{0.15}PbI_3$ | 100 | 93 | 91 | 89 | 88 |
| Example 28 | 10% | 90% | Argon | $Cs_{0.05}FA_{0.8}MA_{0.15}PbI_3$ | 100 | 88 | 84 | 82 | 78 |
| Comparative Example 1 | 1.5% | 98.5% | Nitrogen | $CH_3NH_3PbI_3$ | 100 | 70 | 61 | 50 | 43 |
| Comparative Example 2 | | 100% | Nitrogen | $CH_3NH_3PbI_3$ | 100 | 69 | 60 | 50 | 42 |
| Comparative Example 3 | 7% | 93% | Nitrogen | $CH_3NH_3PbI_3$ | 100 | 75 | 70 | 64 | 58 |
| Comparative Example 4 | 98% | 2% | Dry air | $CH_3NH_3PbI_3$ | 100 | 74 | 69 | 65 | 59 |
| Comparative Example 5 | 7% | 93% | Nitrogen | $HC(NH_2)_2PbI_3$ | 100 | 82 | 78 | 73 | 68 |
| Comparative Example 6 | 7% | 93% | Nitrogen | $Cs_{0.05}FA_{0.8}MA_{0.15}PbI_3$ | 100 | 85 | 81 | 78 | 73 |

It can be learned from Table 1 that, as compared with 100% nitrogen contained in the sealed cavity, in a case that ammonia gas having a volume fraction of 10% or more is contained in the sealed cavity of the perovskite solar cell, an attenuation rate of light conversion efficiency of the cell after storage in a high temperature and high humidity environment is reduced, effectively enhancing thermal stability of the cell. Even a small amount of dry air (for example, 2 vol %) contained in the sealed cavity of the perovskite solar cell causes a significant decrease in the thermal stability of the cell. It can be found through the above experiments that, for an embodiment in which the sealed cavity contains 10 vol % or more ammonia gas and the residual gas is inert gas, thermal stability of the perovskite solar cell is improved. Although an action mechanism is not clear, the inventors speculate a possible reason may be that, in an environment with the temperature of 85° C. and 85% relative humidity, a perovskite active material experiences thermal decomposition due to migration of organic cations, and when a specified amount of ammonia gas is present in the high temperature and high humidity environment, the thermal decomposition of the perovskite material is effectively inhibited, so that the thermal stability is improved.

In conclusion, in this application, out of consideration of costs, safety, stability, and other factors, the more than 10 vol % ammonia gas and the residual gas contained in the sealed cavity being selected as inert gas can effectively improve the light conversion efficiency service life of the perovskite cell. Further, 50 vol %-70 vol % ammonia gas being contained in the sealed cavity of the perovskite cell is a preferred solution.

Although this application has been described with reference to the preferred embodiments, various modifications can be made to this application without departing from the scope of this application and the components therein can be replaced with equivalents. In particular, as long as there is no structural conflict, the various technical features mentioned in the embodiments can be combined in any manner. This application is not limited to the specific embodiments disclosed in this specification, but includes all technical solutions falling within the scope of the claims.

The invention claimed is:

1. A perovskite solar cell, comprising:
   a back plate;
   a transparent substrate, wherein a sealed cavity is formed between the transparent substrate and the back plate; and
   a perovskite solar cell device, wherein the perovskite solar cell device is located in the sealed cavity; wherein
   the sealed cavity contains ammonia gas having a volume fraction of 50%-70% and residual inert gas; wherein
   the inert gas is selected from at least one of nitrogen, argon, helium, and neon, and
   a chemical formula of a perovskite material of the perovskite solar cell device is $ABX_3$, wherein A comprises an organic amine cation, B is a metal cation, and X is a halogen anion or $SCN^-$, wherein in $ABX_3$, A comprises at least one of $CH_3NH_3^+$ and $HC(NH_2)_2^+$ and B comprises at least one of $Pb_2^+$, $Sn_2^+$, and $Ge^{2+}$;
   a sealing element, the sealing element connecting the transparent substrate and the back plate to form the sealed cavity;
   the sealing element is a sealant;
   the sealant is around a periphery of the perovskite solar cell device, and the back plate is fastened to the perovskite solar cell device using the sealant.

2. The perovskite solar cell according to claim 1, wherein in $ABX_3$, A further comprises at least one of $Cs^+$, $Rb^+$, and $K^+$.

3. The perovskite solar cell according to claim 1, wherein the sealant is further located on at least part of a surface or the entire surface on a side of the back plate facing toward the perovskite solar cell device.

4. A method for preparing the perovskite solar cell of claim 1.

5. An electric device, wherein the electric device comprises the perovskite solar cell according to claim 1, and the perovskite solar cell serves as a power source or an energy storage unit of the electric device.

\* \* \* \* \*